(12) United States Patent
Chen et al.

(10) Patent No.: US 6,684,164 B1
(45) Date of Patent: Jan. 27, 2004

(54) TRUE DEFECT MONITORING THROUGH REPEATING DEFECT DELETION

(75) Inventors: Kung-Yi Chen, Hsinchu (TW); Wei-Ming Chen, Hsinchu (TW); Shu-Ling Ku, Hsinchu (TW); Mao-I Ting, Hsinchu (TW); Lien-Che Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,908

(22) Filed: Aug. 28, 2002

(51) Int. Cl.[7] .................................................. G06K 9/64
(52) U.S. Cl. ................. 702/35; 250/559.39; 356/237.1; 382/149
(58) Field of Search ........................ 356/237.1; 438/12; 700/110; 382/149, 148; 250/559.39, 559.45; 702/35

(56) References Cited

U.S. PATENT DOCUMENTS

| | | | | |
|---|---|---|---|---|
| 5,831,865 A | * | 11/1998 | Berezin et al. | ................. 716/7 |
| 6,232,787 B1 | * | 5/2001 | Lo et al. | ...................... 324/751 |
| 6,347,150 B1 | * | 2/2002 | Hiroi et al. | ................. 382/149 |
| 6,423,557 B1 | * | 7/2002 | Steffan et al. | ................. 438/16 |

* cited by examiner

*Primary Examiner*—Kamini Shah
(74) *Attorney, Agent, or Firm*—Jianq Chyun IP Office

(57) ABSTRACT

A method of deleting repeating defects having no effect on product yield of a wafer so that true defects on the wafer are more readily found. A wafer having a plurality of dies thereon is provided. The wafer is scanned to find any repeating defects. If the repeating defects have no effect on the product yield, the area around the repeating defects is marked out as "don't care" region. Another wafer scanning operation to find the true defects is subsequently conducted by scanning the region outside the "don't care" region.

8 Claims, 2 Drawing Sheets

TRUE DEFECT MONITORING THROUGH REPEATING DEFECT DELETION

BACKGROUND OF INVENTION

1. Field of Invention

The present invention relates to a method of monitoring semiconductor manufacturing process. More particularly, the present invention relates to a method of removing repeating defects that have no effects on yield and provides a better monitoring of true defects.

2. Description of Related Art

In most plants for manufacturing semiconductors, monitoring stations are frequently set up along a production line after a critical processing operation. The purpose of having a monitoring station is to find out as many defects as possible before subsequent processes are conducted. If defects are left unchecked and the manufacturing operations are permitted to continue as usual, ultimate yield of the product may be severely affected.

For example, in a photomask fabrication process, abnormal patterns are sometimes formed on the photomask. In general, such abnormal mask may be difficult to discover. However, if the abnormal pattern is transferred to a wafer in a subsequent photolithographic process, defects are formed on the wafer. In particular, if a step and repeat exposure technique is used to transfer mask pattern, defects will repeatedly appear in a wafer. These defects are often referred to as repeating defects.

Sometimes, such repeating defects have effects on the yield of a given product. However, a conventional monitoring station will regard the repeating defects as defects in general regardless of the repetitive nature. Hence, the probability of finding out true defects is compromised. This is because most monitoring stations operate by sampling out a portion of the defects to perform an analysis. When repeating defects that have no effect on yield are included in the sample, the monitoring station is less likely to pick up true defects that might affect the yield. Ultimately, effectiveness of the monitoring station is reduced.

Furthermore, if a wafer contains repeating defects, the chance of finding new repeating defects from the wafer is greatly diminished. The new repeating defects on the wafer may appear as a result from problems in a manufacturing station or an abnormal change in the surrounding environment. Anyway, if the defects are not found in time to make necessary re-adjustment or repair to the machines, these defects may be carried forward down the production line leading to a severe loss in production time and yield.

SUMMARY OF INVENTION

Accordingly, one object of the present invention is to provide a method for deleting repeating defects that have no effect on product yield so that the probability of finding true defects that have an effect on product yield is increased.

A second object of this invention is to provide a method for deleting repeating defects that have no effect on product yield so that any new repeating defects on a wafer can be found more readily.

To achieve these and other advantages and in accordance with the purpose of the invention, as embodied and broadly described herein, the invention provides a method for deleting repeating defects that have no effect on the product yield of wafer. A wafer having a plurality of dies thereon is provided. A first scanning operation is conducted to find out if there are any repeating defects. The repeating defects include any abnormal pattern due to a transfer from a photomask during a photolithographic process. If no repeating defects are found on the wafer in the first scanning operation, the first scanning data is immediately conducted to find any defects on the wafer that truly affects the ultimate product yield. However, if repeating defects are found, the repeating defects are assessed to determine if such defects might affect the yield. The effect of the repeating defects on yield is assessed through a testing operation. If the repeating defects are found to affect subsequent yield, the photomask used in the previous photolithographic process must berejected. On the other hand, if the repeating defects have no effect on the yield, the area on the wafer containing the repeating defects is marked out as "don't care" region. A second scanning operation is next carried out scanning the regions outside the "don't care" region to find out other true defects on the wafer.

In this invention, repeating defects that do not affect yield are deleted. Hence, the probability of finding true defects from a wafer is increased. Moreover, by deleting the repeating defects that result from an abnormality in the photomask and do not have any effect on yield, new repeating defects can be easily found. In addition, each marked-out "don't care" region typically occupies only about $1/250000^{th}$ of the area of each die. Therefore, the deleting process will hardly compromise the defect-monitoring capacity of the monitoring station.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
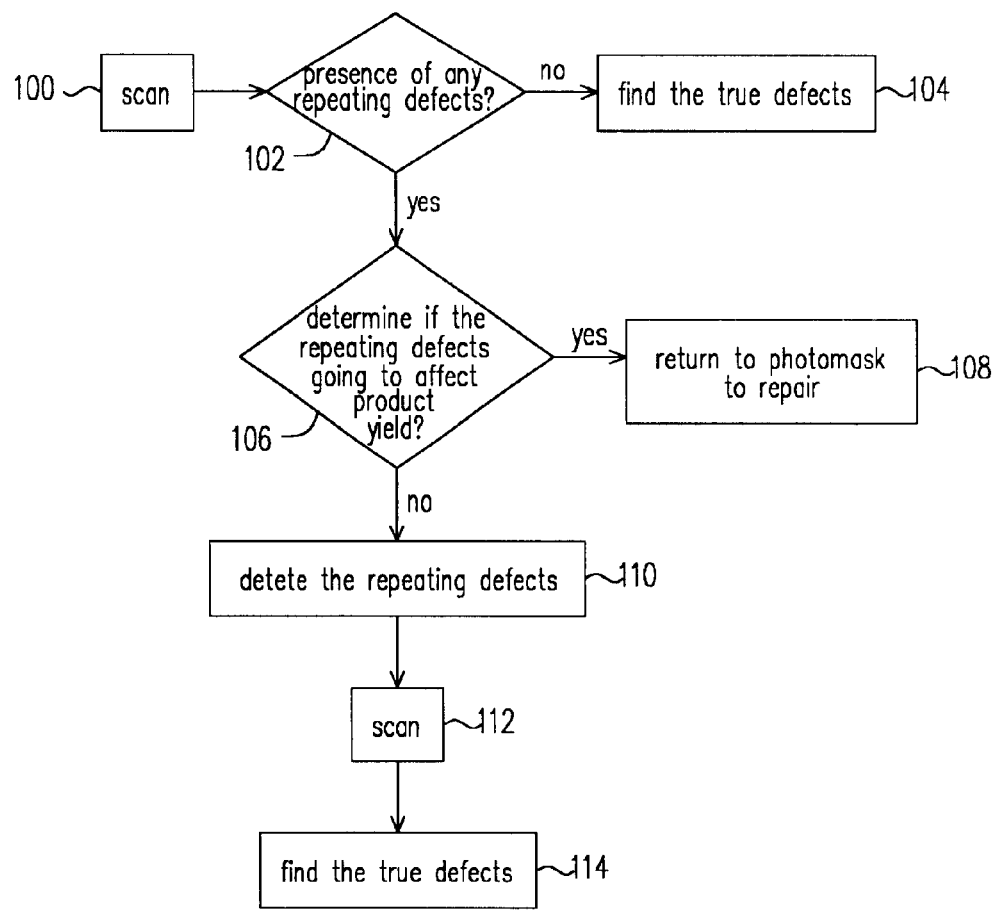
FIG. 1 is a flow chart showing the steps required to delete repeating defects that do not affect product yield and facilitate the finding of true defects in a wafer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart showing the steps required to delete repeating defects that do not affect product yield and facilitate the finding of true defects in a wafer according to one preferred embodiment of this invention. To delete repeating defects on the wafer that have no effect on product yield, a scanning operation 100 is first conducted. The wafer is scanned in step 100 through a monitoring station. After the scanning operation, the presence or absence of repeating defects is determined in step 102.

In this embodiment, repeating defects are formed when the mask for transferring pattern has some anomalies. Hence, the wafer receives a defective pattern after repeat and step in a photolithographic process. However, not all of these repeating defects are critical to the yield. Those repeating defects that have no effect on product yield can be ignored.

If no repeating defects are found on the wafer, the wafer is scanned directly to find true defects (in step 104). True defects refer to the type of defects that affect product yield. However, if repeating defects are found in step 102, a test is carried out to determine if the repeating defects affect yield (in step 106).

In step 106, if the repeating defects on the wafer are of the types that affect the yield, that is, likely to lower the yield, the mask used in a previous photolithographic process must be rejected (in step 108). This is because the defects are formed from an abnormal mask.

Figure 2:
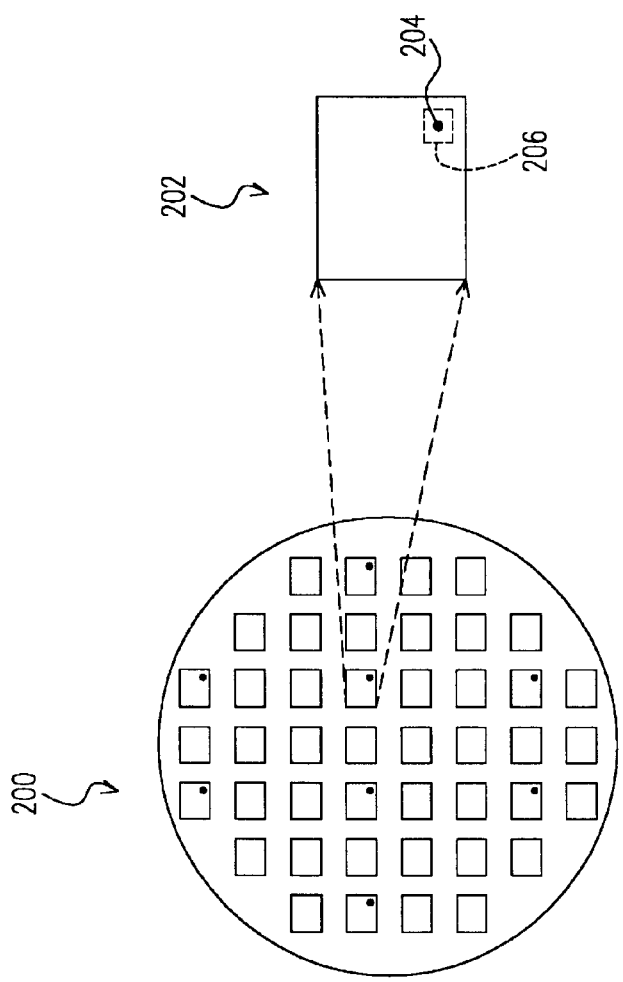
FIG. 2 is a simplified top view of a wafer with repeating defects thereon.

On the other hand, if the repeating defects found in step 106 have no effect on the yield, the repeating defects are deleted. The method of deleting the repeating defects is explained with reference to FIG. 2. In fact, FIG. 2 is a simplified top view of a wafer with repeating defects thereon. The wafer 200 has a plurality of dies 202 thereon. As shown in FIG. 2, repeating defects 204 are found in the wafer 200. When the repeating defects are judged to have no effect on the yield, the repeating defects 204 are deleted. In this embodiment, the method of deleting the repeating defects 204 from the wafer 200 includes using the existing functions of a monitoring station to mark out areas containing repeating defects 204 having no effect on yield as "don't care" regions 206. In a subsequent scanning operation, these "don't care" regions 206 are excluded from the scanning range.

In this embodiment, the "don't care" region 206 marked for deletion occupies an area only about $1/250000^{th}$ of a die. Since the mark-out area is only $1/250000^{th}$ of the area of a die, capacity of the monitoring station for finding defects in the wafer after the deletion is little affected.

After deleting the repeating defects in step 110, another scanning operation is carried out in step 112. In the scanning step 112, the monitoring station samples a portion of the defects on the wafer and performs an analysis. Because repeating defects that have no effect on yield have already been deleted, the monitoring station no longer selects those repeating defects in the scanning operation. In step 114, the sampled defects are analyzed to find true defects that may affect the yield.

Note that repeating defects having no effect on yield are deleted according to this invention. Hence, any new repeating defects are easily found. Since these new repeating defects may result from a defective processing station or abnormal processing environment, early discovery of such defects facilitates early inspection or repair. Ultimately, product yield is improved.

Furthermore, by removing those repeating defects that have no effect on yield before sampling defects from the wafer for analysis, the monitoring station will only pick up those repeating defects that have not been investigated before. Consequently, the probability of finding any true defects that might affect the yield is increased. Moreover, by removing those repeating defects that have no effect on yield, any new repeating defects can be found quickly and efficiently. In addition, each marked-out "don't care" region typically occupies only about $1/250000^{th}$ of the area of each die. Therefore, the deleting process will hardly compromise the defect-monitoring capacity of the monitoring station.

In conclusion, major advantages of this invention include:
1. By deleting repeating defects that do not affect yield, the probability of finding true defects from a wafer is increased.
2. By deleting repeating defects that do not have any effect on yield, any new repeating defects can be quickly and efficiently found.
3. Since each "don't care" region marked out for deletion typically occupies only about $1/250000^{th}$ of the area of each die, the deletion process will hardly compromise the defect-monitoring capacity of the monitoring station.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of monitoring true defects by deleting repeating defects on a wafer that have no effect on product yield, comprising the steps of:
   determining if the repeating defects are the type that affect yield;
   if the repeating defects are of the type that does not affect the yield, marking out the area containing the repeating defects as a 'don't care' region; and
   scanning the region outside the 'don't care' region to find any true defects on the wafer.

2. The method of claim 1, wherein the 'don't care' region marked out for deletion occupies an area roughly $1/250000^{th}$ in the wafer.

3. The method of claim 1, wherein the repeating defects are formed from a photomask having a defective pattern during a photolithographic process.

4. The method of claim 3, wherein the photomask has to be repaired if the repeating defects are of the type that affects the product yield.

5. A method of monitoring true defects by deleting repeating defects on a wafer that have little or no effect on product yield, comprising the steps of:
   conducting a first scanning operation to determine if the wafer contains any repeating defects;
   if no repeating defects are found on the wafer,
      conducting a second scanning operation to find true defects on the wafer, and
   if repeating defects are found on the wafer,
      determining if the repeating defects are of the type that affects product yield;
   if the repeating defects do not affect the yield,
      marking out the area containing the repeating defects as a 'don't care' region; and
   conducting the second scanning operation to find any true defects on the wafer by scanning the wafer outside the 'don't care' region.

6. The method of claim 5, wherein the area marked-out as 'don't care' region occupies roughly $1/250000^{th}$ in the wafer.

7. The method of claim 5 wherein the repeating defects are formed from a photomask having a defective pattern during a photolithographic process.

8. The method of claim 7, wherein the photomask has to be repaired if the repeating defects are of the type that affects the product yield.

* * * * *